United States Patent [19]

Masuda et al.

[11] Patent Number: 4,719,373
[45] Date of Patent: Jan. 12, 1988

[54] GATE CIRCUIT OF COMBINED FIELD-EFFECT AND BIPOLAR TRANSISTORS

[75] Inventors: Ikuro Masuda, Hitachi; Kazuo Kato, Ibaraki; Takao Sasayama; Yoji Nishio, both of Hitachi; Shigeo Kuboki, Nakaminato; Masahiro Iwamura, Hitachi, all of Japan

[73] Assignee: Hitachi, Ltd., Tokyo, Japan

[21] Appl. No.: 45,216

[22] Filed: Apr. 30, 1987

Related U.S. Application Data

[63] Continuation of Ser. No. 513,056, Jul. 12, 1983, abandoned.

[30] Foreign Application Priority Data

Jul. 12, 1982 [JP] Japan .................................. 57-119815

[51] Int. Cl.⁴ ........................ H03K 17/60; H03K 3/33; H03K 19/01
[52] U.S. Cl. .................................. 307/570; 307/270; 307/300; 307/446
[58] Field of Search ............... 307/446, 285, 270, 300, 307/570, 304

[56] References Cited

U.S. PATENT DOCUMENTS

| | | | |
|---|---|---|---|
| Re. 27,804 | 10/1973 | Treadway | 307/280 |
| 3,541,353 | 11/1970 | Seelbach et al. | 307/446 |
| 3,786,485 | 1/1978 | Wojcik | 307/280 |
| 3,831,102 | 8/1974 | Medal | 307/300 |
| 3,867,644 | 2/1975 | Cline | 307/317 A |
| 4,132,906 | 1/1979 | Allen | 307/300 |
| 4,317,081 | 2/1982 | Kobayashi | 307/300 |
| 4,616,146 | 10/1986 | Lee et al. | 307/570 |

OTHER PUBLICATIONS

"Characteristics and Operation of MOS Field Effect Devices", by Paul Richman, McGraw Hill, New York, TK 7871.95, 1967, pp. 116–118.

*Primary Examiner*—Stanley D. Miller
*Assistant Examiner*—B. P. Davis
*Attorney, Agent, or Firm*—Antonelli, Terry & Wands

[57] ABSTRACT

A high-speed operation, low-power consumption gate circuit structure comprises a combination of complementary field-effect-transistors and bipolar transistors and discharge means for discharging accumulated charges from these transistors when the field-effect-transistors and bipolar transistors are turned off.

23 Claims, 17 Drawing Figures

GATE CIRCUIT OF COMBINED FIELD-EFFECT AND BIPOLAR TRANSISTORS

This application is a continuation of application Ser. No. 513,056 filed on July 12, 1983, abandoned.

This invention relates to gate circuits, and more particularly to a gate circuit formed of a combination of field-effect transistors and bipolar transistors.

There is known a gate circuit formed of a combination of field-effect transistors and bipolar transistors so as to achieve high-speed operation and low-power consumption, for example, an inverter circuit shown in FIG. 1. See Japanese Patent Laid-Open No. 54-148469 (1979).

This inventor circuit is formed of a P-channel metal (silicon)-oxide-semiconductor field-effect-transistor (hereinafter, referred to simply as PMOS) 50, an N-channel metal (silicon) oxide-semiconductor field-effect-transistor (hereinafter, referred to simply as NMOS) 51, an NPN transistor (hereinafter, referred to simply as NPN) 53, and a PNP transistor (hereinafter, referred to simply as PNP) 54.

In this inverter circuit, when an input 55 is at "0" level, the PMOS 50 is turned on but the NMOS 51 off. Consequently, the base potential of the NPN 53 and PNP 54 is increased to turn on the NPN 53 but turn off the PNP 54, and thus an output 56 becomes at "1" level. When the input 55 is at "1" level, the PMOS 50 is turned off but the NMOS 51 on. Consequently, the base potential of the NPN 53 and PNP 54 is reduced to turn off the NPN 53 but turn on the PNP 54, and thus the output 56 becomes at "0" level.

However, since the bipolar transistors NPN 53 and PNP 54 used are complementary and difficult to be matched in their switching characteristics, the trailing edge of the output signal 56 is delayed; This is because the PNP involved in the complementary transistors is inferior in performances such as current amplification factor to NPN.

There is also known a two-input NOR gate circuit shown in FIG. 2a (IEEE. Trans. Electron Devices, vol. ED-16, No. 11, pp. 945-951, Nov. 1969). This two-input NOR circuit is a combination of a C-MOS transistor NOR gate circuit having PMOSs 200 and 201 and NMOSs 202 and 203 as shown in FIG. 2b, and NPNs 301 and 302. In this two-input NOR gate circuit, when the NPNs 301 and 302 are turned off from the on-state, the time required for the switching from the on-state to the off-state is long because of no means for forcibly extracting or drawing out minority charges accumulated on the bases of the NPNs 301 and 302. Thus, the first and second NPNs 301 and 302 stay long in the on-state, so that the switching time as well as the power consumption increases.

Accordingly, it is an object of this invention to provide a high-speed, low-power consumption gate circuit formed of field-effect transistors and bipolar transistors to obviate the problems encountered in C-MOS circuits and bipolar transistor circuits.

According to an aspect of this invention, there is proposed a high-speed, low-power consumption gate circuit capable of preventing first and second bipolar transistors from simultaneously turning on by providing the gate circuit of combined field-effect transistors and bipolar transistors with discharge means for discharging accumulated charges from the transistors when the field-effect transistors and bipolar transistors are turned off.

The other objects and features of this invention will be evident from the description of the embodiment taken in conjunction with the accompanying drawings in which.

Embodiments of this invention will hereinafter be described with reference to the drawings.

EMBODIMENT 1

Figure 1:
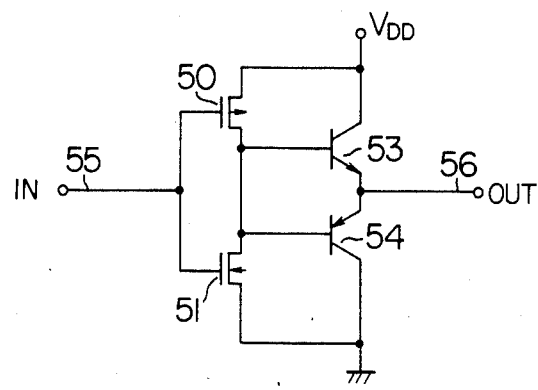
FIG. 1 is a circuit diagram showing a conventional inverter circuit.
Figure 2A:
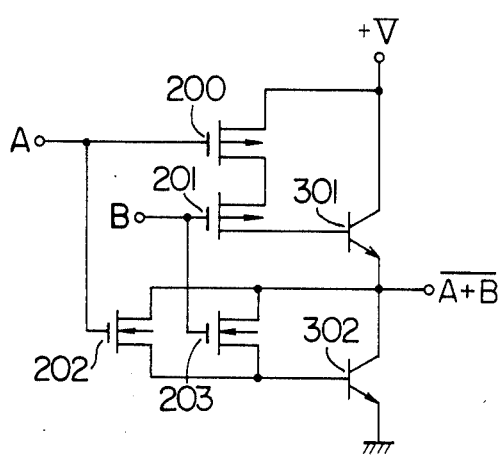
FIGS. 2a and 2b are circuit diagrams showing conventional two-input NOR circuits.
Figure 2B:
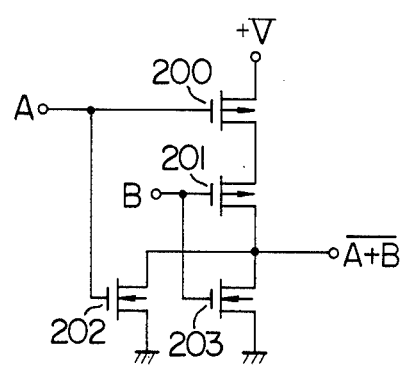
Figure 3:
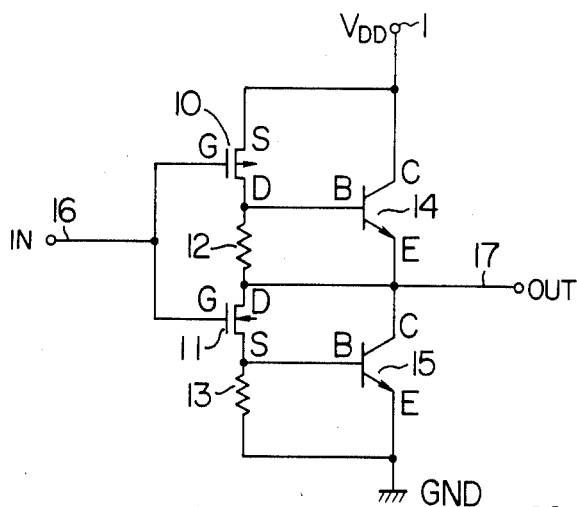
FIG. 3 is a circuit diagram showing an inverter circuit according to a first embodiment of this invention.

FIG. 3 shows an inverter circuit of the first embodiment of this invention.

Referring to FIG. 3, there is shown a first NPN bipolar transistor (hereinafter, referred to simply as first NPN) 14 having its collector C connected to a power supply terminal 1 at which a first fixed potential $V_{DD}$ is maintained, and its emitter E connected to an output terminal 17. Shown at 15 is a second NPN bipolar transistor (hereinafter, referred to simply as second NPN) having its collector C connected to the output terminal 17 and its emitter E connected to a ground potential GND as a second fixed potential. Shown at 10 is a P-channel metal (silicon)-oxide-semiconductor field-effect-transistor (hereinafter, referred to simply as PMOS) having its gate G connected to an input terminal 16 and its source S and drain D respectively connected to the collector C and base B of the first NPN. Shown at 11 is an N-channel metal (silicon)-oxide-semiconductor field-effect-transistor (hereinafter, referred simply as NMOS) having its gate G connected to the input terminal 16, and its drain D and source S respectively connected to the collector C and base B of the second NPN. Shown at 12 is a resistor connecting the drain D of the PMOS 10 with the drain D of the NMOS 11 and at 13 is a resistor connecting the base B with emitter E of the second NPN 15.

Figure 4:
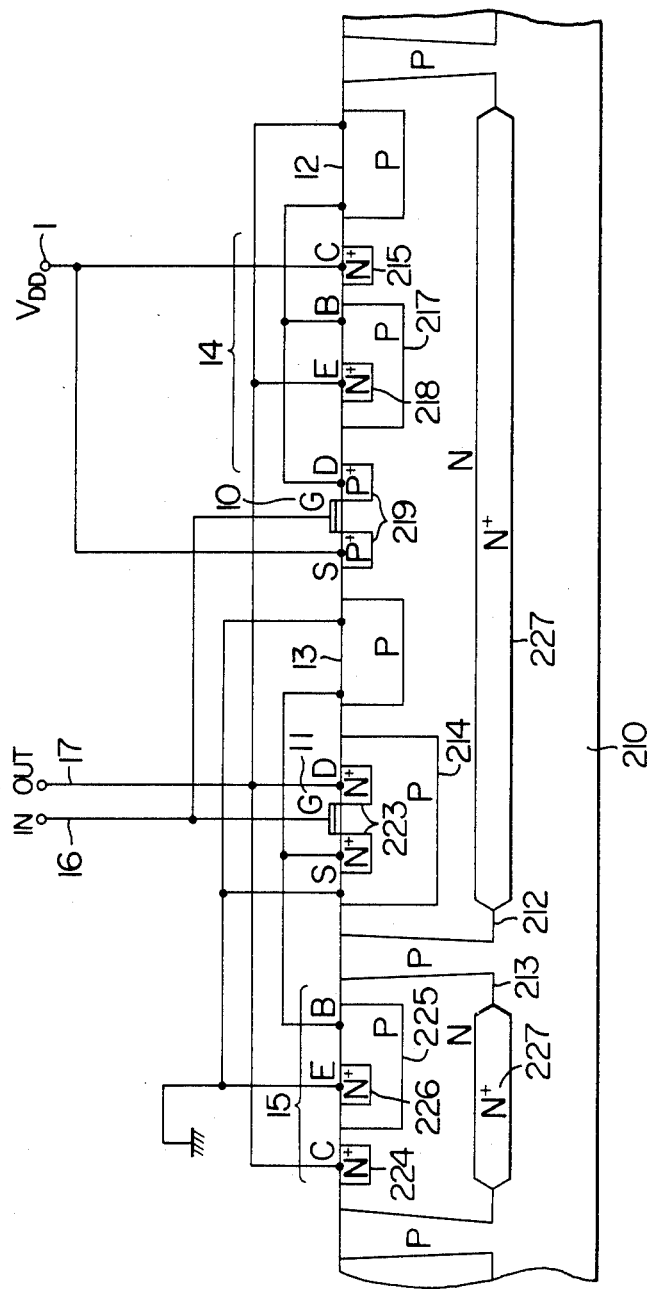
FIG. 4 is a schematic diagram showing a cross-section of the inverter circuit of FIG. 3, which is integrated in a semiconductor substrate.

FIG. 4 schematically shows the cross-section of a semiconductor integrated circuit structure of the inverter circuit illustrated in FIG. 3. The PMOS 10, first NPN 14, resistors 12 and 13 and NMOS 11 are formed in an island 212 of a semiconductor substrate 210, and the second NPN 15 in an island 213 thereof. Shown at 227 is a buried layer. A P+ region 219 and a gate electrode G constitute the PMOS 10 and an N+ region 223 and a gate electrode G within a P well 214 constitute the NMOS 11. The first NPN 14 comprises a P region 217, as its base B, an N+ region 218 within the P region 217 as its emitter E and an N+ region 215 as its collector C. The second NPN 15 comprises a P region 225 within the island 213 as its base B, an N+ region 226 within the P region 225 as its emitter E, and an N+ region 224 as its collector C.

Table 1 lists the logic operations of the inverter circuit of this embodiment.

TABLE 1

| Input 16 | PMOS 10 | NMOS 11 | NPN 14 | NPN 15 | Output 17 |
|---|---|---|---|---|---|
| "0" | ON | OFF | ON | OFF | "1" |
| "1" | OFF | ON | OFF | ON | "0" |

When the input terminal 16 is at "0" level the PMOS 10 is turned on but NMOS 11 off. Thus, the base potential of the first NPN 14 increases to turn on the NPN 14. At this time, since the NMOS 11 is turned off, current to the second NPN 15 is stopped and the charges accumulated in the base B of the second NPN 15 are drawn out through the resistor 13 to the ground, so that the second NPN 15 is rapidly turned off.

Therefore, the emitter current of the first NPN 14 charges the load (not shown) and the output turminal 17 rapidly becomes at "1" level.

When the input terminal 16 is at "1" level, the PMOS 10 is made off but the NMOS 11 on. At this time, since the PMOS 10 is off, the current to the NPN 14 stops and the charges stored on the base B of the first NPN 14 and in the drain D of the PMOS 10 are drawn out through the resistors 12 and 13 to the ground, so that the first NPN 14 is rapidly turned off. In addition, since the NMOS 11 is on to form a short circuit between its drain D and source S, the second NPN 15 is supplied at its base B with the current from the output terminal 17 and with the charges stored in the base B of the first NPN 14 and in the drain D of the PMOS 10 as mentioned above, and thereby the NPN 15 is rapidly turned on. Consequently, the output terminal 17 rapidly becomes at "0" level.

The function of the resistor 12 will further be described. When the PMOS 10 and the first NPN 14 are switched from the on-state to the off-state, the resistor 12 extracts the charges accumulated in the drain D of the PMOS 10 and in the base B of the first NPN 14 to rapidly turn off the first NPN 14 and supplies the extracted charges via the NMOS 11 in the on-state to the base B of the second NPN 15 to rapidly turn on the second NPN 15.

In addition, since the resistor 12 is provided between the drain D of the PMOS 10 and the drain D of the NMOS 11, a conductive path for causing short-circuiting is not formed between the power terminal 1 and GND and thus low-power consumption in the C-MOS circuit can be achieved. In other words, if the resistor 12 were connected between the drain D of the PMOS 10 and GND, a conductive path would be formed between the power terminal 1 and GND when the input terminal 16 is at "0" level, and thus current would always flow therethrough to increase power consumption.

Moreover, in this embodiment, since the resistor 12 is also connected to the output terminal 17, the potential at the output terminal 17, when the input terminal 16 is at "0" level, can be raised to the potential at the power terminal 1 through the PMOS 10 and resistor 12, assuring enough noise immunity.

The function of the resistor 13 will hereinafter be described. As mentioned before, the resistor 13, when the NMOS 11 and second NPN 15 are switched from on-state to off-state, discharges the charges accumulated in the base B of the second NPN 15 so as to rapidly turn off the second NPN 15. Also, in this embodiment, when the input terminal 16 is at "1" level, the output terminal 17 can be decreased to "0" level through the resistor 13 and NMOS 11, assuring enough noise immunity.

Moreover, in this embodiment, the bipolar transistors used are of the same NPN-type, and are thus advantageous in making the switching characteristics easily uniform to each other.

Furthermore, in this embodiment, since no PNP transistor with low current amplification is used, the output signal is never late to fall off and thus high-speed operation is ensured.

EMBODIMENT 2

Figure 5:
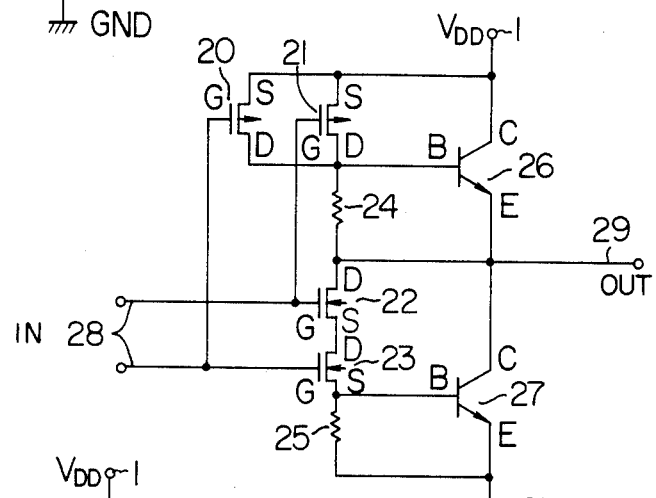
FIG. 5 is a circuit diagram showing a two-input NAND circuit according to a second embodiment of this invention.

FIG. 5 shows a two-input NAND circuit of a second embodiment of this invention.

Referring to FIG. 5, there are shown a first NPN 26 having its collector C connected to the power supply terminal 1, and its emitter E connected to an output terminal 29, a second NPN 27 having its collector C connected to an output terminal 29 and its emitter E connected to a ground potential GND, and two input terminals 28. In addition, shown at 20 and 21 are PMOSs having their gates G connected respectively to one and the other of the input terminals 28, and their source S - drain D paths connected in parallel between the collector C and base B of the first NPN 26, and at 22 and 23 are NMOSs having their gates G connected respectively to one and the other of the input terminals 28 and their drain D - source S paths connect in series between the collector C and base B of the second NPN 27. A resistor 24 is connected between the common drain D of the PMOSs 20 and 21 and the drain D of the NMOS 22, and a resistor 25 is connected between the base B and emitter E of the second NPN 27.

Table 2 shows the logic operations of this embodiment.

TABLE 2

| Input 28 | PMOS 20,21 | NMOS 22,23 | NPN 26 | NPN 27 | Output 29 |
|---|---|---|---|---|---|
| Either "0" | Either ON | Either OFF | ON | OFF | "1" |
| Both "0" | Both ON | Both OFF | ON | OFF | "1" |
| Both "1" | Both OFF | Both ON | OFF | ON | "0" |

First, when either one of the input terminals 28 is at "0" level, either one of the PMOSs 20 and 21 is turned on and either one of the NMOSs 22 and 23 is turned off. Thus, the base potential of the first NPN 26 increases and thus the NPN 26 is turned on. At this time, since either one of the NMOSs 22 and 23 is turned off, current to the second NPN 27 stops flowing and the charges accumulated in the base B of the second NPN 27 are extracted, so that the second NPN 27 is rapidly turned off.

Therefore, the emitter current of the first NPN 26 charges the load to rapidly raise the potential of the output end 29 to "1" level.

When both of the input terminals 28 are at "0" level, both the PMOSs 20 and 21 are turned on and both the NMOSs 22 and 23 are turned off. Thus, the operation is the same as above, the output terminal 29 becoming at "1" level.

On the other hand, both the input terminals 28 are at "1" level, both of the PMOSs 20 and 21 are turned off, and both NMOSs 22 and 23 are turned on. At this time, since both the PMOSs 20 and 21 are turned off, current to the first NPN 26 stops flowing and the charges accumulated in the base B of the first NPN 26 are extracted, so that the first NPN 26 is rapidly turned off. Also, since the NMOSs 22 and 23 are turned on to form short circuit between the drains D and sources S, the second NPN 27 is supplied at its base B with the current from the output terminal 29 and with discharge current from the base B of the first NPN 26 as described previously so as to rapidly turn on. Thus, the output terminal 29 rapidly becomes at "0" level.

In this embodiment, the same effect as in the first embodiment can be achieved.

While in this embodiment a 2-input NAND circuit is described as an example, a 3-input, 4-input or generally k-input NAND circuit (k≧2) can be used as an example of this invention.

EMBODIMENT 3

Figure 6:
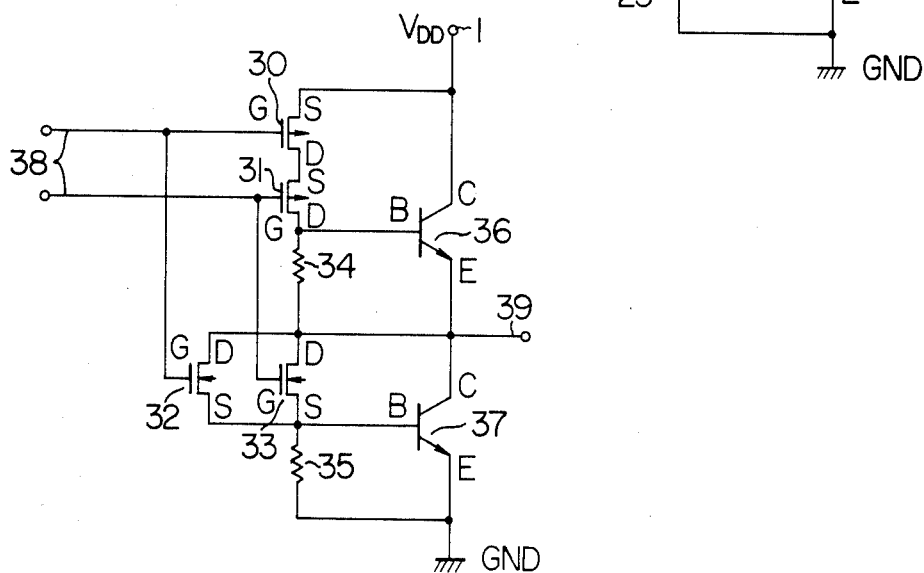
FIG. 6 is a circuit diagram showing a two-input NOR circuit according to a third embodiment of this invention.

FIG. 6 shows a two-input NOR circuit of a third embodiment of this invention.

In FIG. 6, reference numeral 36 represents a first NPN having its collector C connected to power terminal 1 and its emitter E connected to an output terminal 39, 37 a second NPN having its collector C connected to the output terminal 39 and its emitter E connected to ground potential GND, 38 two input terminals, 30 and 31 PMOSs having their gates G connected to one and the other of the input terminals 38 and their source S - drain D paths connected in series between the collector C and base B of the first NPN 36. In addition, numerals 32 and 33 represent NMOSs having their gates G connected to one and the other of the input terminals 38 and the drain D - source S paths connected in parallel between the collector C and base B of the second NPN 37, 34 a resistor connecting the drain D of the PMOS 31 with the drains D of the NMOSs 32 and 33, and 35 a resistor connecting the base B with emitter E of the second NPN 37.

Table 3 lists the logic operations of this embodiment.

TABLE 3

| Input 38 | PMOS 30,31 | NMOS 32,33 | NPN 36 | NPN 37 | Output 39 |
|---|---|---|---|---|---|
| Both "0" | Both ON | Both OFF | ON | OFF | "1" |

TABLE 3-continued

| Input 38 | PMOS 30,31 | NMOS 32,33 | NPN 36 | NPN 37 | Output 39 |
|---|---|---|---|---|---|
| Either "1" | Either OFF | Either ON | OFF | ON | "0" |
| Both "1" | Both OFF | Both ON | OFF | ON | "0" |

First, when both of the input terminals 38 are at "0" level, both the PMOSs 30 and 31 are turned on, and both the NMOSs 32 and 33 are turned off. Thus, the base potential of the first NPN 36 increases and as a result the NPN 36 is turned on. At this time, since both the NMOSs 32 and 33 are turned off, current to the second NPN 37 stops flowing and the charges accumulated in the base of the second NPN 37 are extracted, so that the second NPN 37 is rapidly turned off.

Therefore, the emitter current of the first NPN 37 charges the load to rapidly raise the output terminal 39 to "1" level.

When either of the input terminals 38 is at "1" level, either of the PMOSs 30 and 31 is turned off and either of the NMOSs 32 and 33 is turned on. At this time, since either of the PMOSs 30 and 31 is turned off, current to the first NPN 36 stops flowing and the charges accumulated in the base B of the first NPN 36 are extracted, so that the first NPN 36 is rapidly turned off. In addition, since the NMOSs 32 and 33 are turned on to form short circuit between the drains D and sources S, the second NPN 37 is supplied at its base B with the current from the output terminal 39 and with the current of the charges accumulated in the base B of the first NPN 36 and in either of the PMOSs 30 and 31, thus rapidly turning on. Therefore, the output terminal 39 rapidly becomes at "0" level.

When both input terminals 38 are at "1" level, both the PMOSs 30 and 31 are turned off, and both the NMOSs 32 and 33 are turned on. Consequently, the operation is the same as above, the output terminal 39 being at "0" level.

Also in this embodiment, the same effect can be achieved as in the first embodiment.

While a two-input NOR circuit is described in this embodiment, this invention can be applied to a 3-input NOR, 4-input NOR or generally k-input NOR circuit (k≧2).

EMBODIMENT 4

Figure 7:
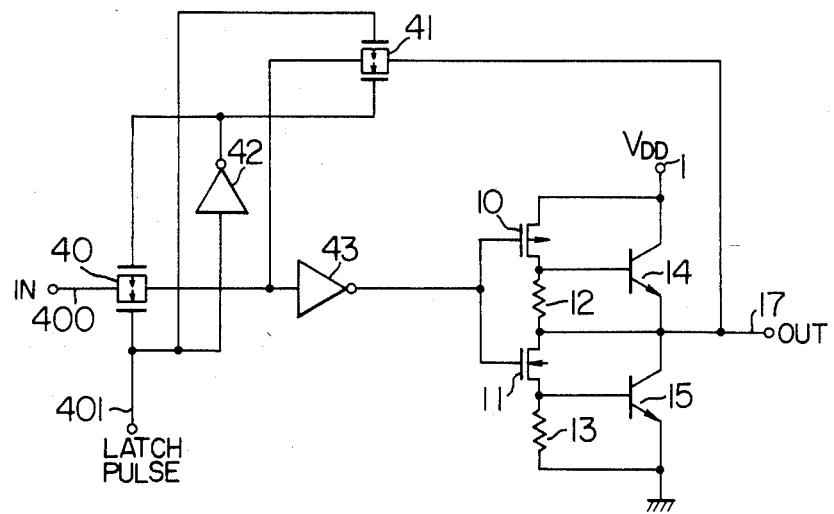
FIG. 7 is a circuit diagram showing a latch circuit according to a fourth embodiment of this invention.

FIG. 7 shows a latch using at its output the inverter circuit shown in FIG. 3, and of a fourth embodiment of this invention.

In FIG. 7, reference numeral 42 represents a CMOS inverter for reversing a latch pulse 401, 40 a transfer gate for transmitting a data input 400, 43 a CMOS inverter constituting a memory portion, and 41 a transfer gate. Like elements corresponding to those of FIG. 3 are identified by the same reference numerals.

In order to latch the data input 400, the latch pulse 401 is made "1". Then, the transfer gate 40 is turned on, and the transfer gate 41 is turned off so that the data is written. Thereafter, when the latch pulse 401 is made "0", the transfer gate 40 is turned off, and the transfer gate 41 is turned on. Consequently, the data is held by the inverter 43, the totem pole output type inverter and transfer gate 41.

According to this embodiment, the latch circuit can be formed by the smallest configuration of a CMOS drive stage and two bipolar output stages, and can be formed as a high-speed, low-power consumption and high-density LSI.

EMBODIMENT 5

Figure 8:
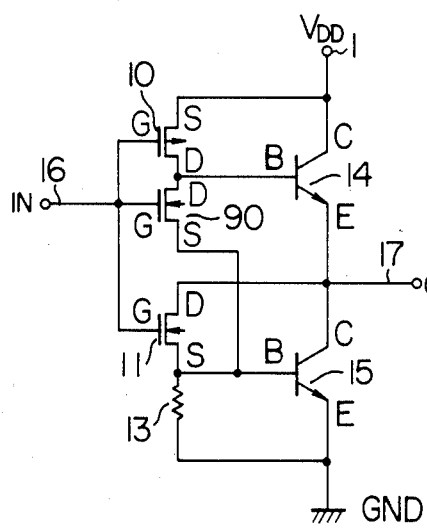
FIG. 8 is a circuit diagram showing an inverter circuit according to a fifth embodiment of this invention.

FIG. 8 shows an inverter circuit of the fifth embodiment of this invention

In this embodiment, the resistor 12 in the first embodiment shown in FIG. 3 is replaced by a second N-channel metal (silicon)-oxide-semiconductor field-effect transistor (hereinafter, referred simply as second NMOS and the NMOS 11 as first NMOS) 90. The second NMOS 90 has its gate G connected to the input end 16, and its drain D and source S connected to the drain D of the PMOS 10 and the base B of the second NPN 15, respectively. Like elements corresponding to those of FIG. 3 are identified by the same reference numerals. The operation of the inverter in FIG. 8 is substantially the same as in FIG. 3.

The circuit of FIG. 8 is different from that of FIG. 3 in that when the first NPN 14 is turned off, or when the input terminal 16 is at "1" level, the second NMOS 90 is turned on, to discharge the charges accumulated in the first NPN 14. Although in FIG. 3 the resistor 12 operates for this purpose, in this embodiment, the source S of the second NMOS 90 is connected to the base B of the second NPN 15 so that the base current is increased to accelerate the switching of the second NPN 15 from the off-state to the on-state. The source S of the second NMOS 90 may be connected to the drain D of the first NMOS 11.

In the first embodiment of FIG. 3 the current is flowed through the resistor 12 when the PMOS 10 is switched from the off-state to the on-state, to delay the rise of the base potential of the first NPN 14, and thus to somewhat delay the switching of the first NPN 14 from the off-state to the on-state, but in this embodiment when the PMOS 10 is turned on from the off-state, the second NMOS 90 is turned off from the on-state so that no current flows between the drain D and source S of the NMOS 90. As a result, the base potential of the first NPN 14 rises faster than in the first embodiment, to accelerate the switching of the NPN 14 from the off- to the on-state According to this embodiment, the second NMOS 90 is used in place of the resistor 12, so as to improve the density of integration and the operation speed, and the source S of the second NMOS 90 is connected to the base of the second NPN 15, so that the operation speed is further improved.

EMBODIMENT 6

Figure 9:
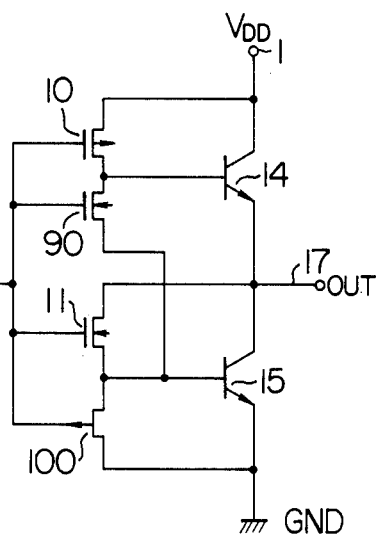
FIG. 9 is a diagram of an inverter circuit according to a sixth embodiment of this invention.

FIG. 9 shows an inverter circuit of a sixth embodiment of this invention.

In this embodiment, the resistor 13 in the fifth embodiment of FIG. 8 is replaced by a P-channel junction field-effect transistor (hereinafter, referred to as PJFET) 100 as a second P-channel field effect transistor. The gate of the PJFET 100 is connected to the input end 16 and the source and drain thereof are connected to the base and emitter of the second NPN 15, respectively.

In FIG. 9, like elements corresponding to those of FIGS. 4 and 8 are identified by the same reference numerals.

The embodiment of FIG. 9 is different from the fifth embodiment of FIG. 8 in that when the second NPN 15 is turned off from the on-state, or when the input terminal 16 is changed from level "1" to "0" level, the charges accumulated in the second NPN 15 are extracted through the PJFET 100. When the charges are discharged, the on-resistance of the PJFET 100 is decreased to accelerated the switching of the second NPN 15 from the on-state to the off-state. When the input terminal 16 changes from "0" to "1" level, the PJFET 100 is changed from the on-state to the off-state and thus the base current to the second NPN 15 is not shunted so that the second NPN 15 is rapidly turned on from the off-state.

This embodiment has an effect for much higher speed.

EMBODIMENT 7

Figure 10:
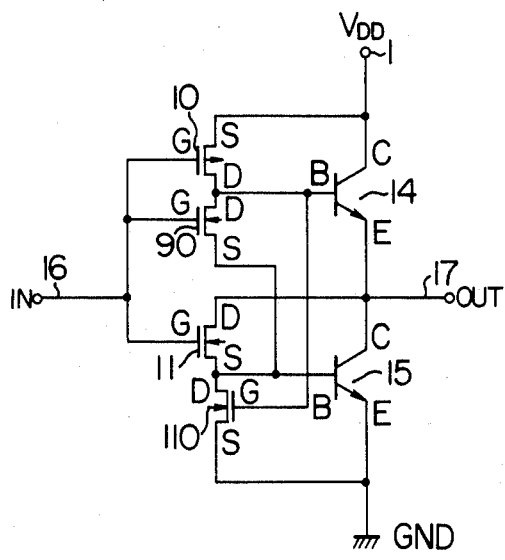
FIG. 10 is a diagram of an inverter circuit according to a seventh of this invention.

FIG. 10 shows an inverter circuit of a seventh embodiment of this invention.

In this embodiment, the resistor 13 in the fifth embodiment in FIG. 8 is replayed by a third N-channel Metal-Oxide Semiconductor field-effect-transistor (hereinafter, referred to simply as third NMOS) 110. In FIG. 10, like elements corresponding to those of FIGS. 3 and 8 are identified by the same reference numerals. The third NMOS 110 has its gate G connected to the base B of the first NPN 14, and its drain D and source S connected to the base B and emitter E of the second NPN 15, respectively.

This embodiment is different from the fifth embodiment of FIG. 8 in that when the second NPN 15 is turned off from the on-state, or when the input terminal 16 is changed from "1" to "0" level, the charges accumulated in the second NPN 15 are extracted through the third NMOS 110. When the input terminal 16 is at "0" level, the high base potential of the first NPN 14 is applied to the gate of the third NMOS 110, which then turns on to form short circuit between the base and emitter of the second NPN 15, extracting the accumulated charges more rapidly.

According to this embodiment, since no resistor is used, higher density of integration can be achieved.

While some modifications of the inverter circuit of FIG. 3 are shown in FIGS. 8, 9 and 10, the present invention can similarly be applied to a multi-input NAND in FIG. 5, a multi-input NOR in FIG. 6 and a latch in FIG. 7.

Figure 11:
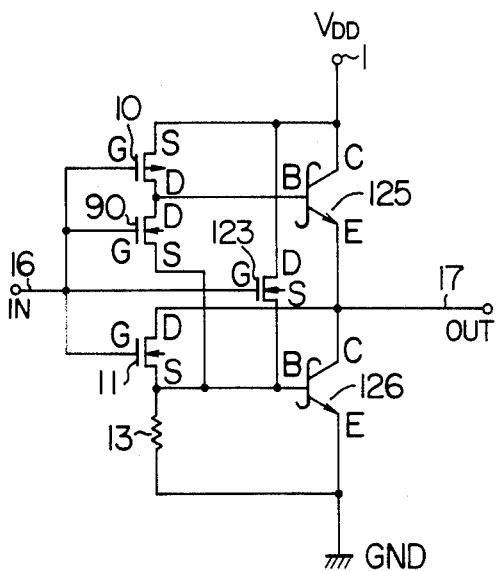
FIG. 11 is a diagram of an inversion output circuit according to an eighth embodiment of this invention.
Figure 12:
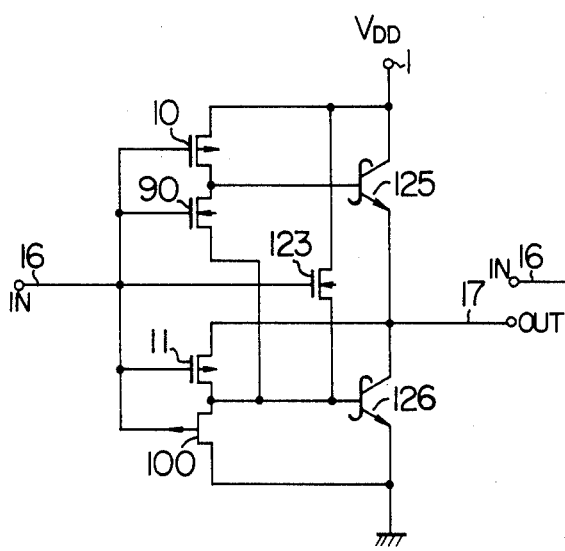
FIG. 12 is a diagram of an inversion output circuit according to a nineth embodiment of this invention.
Figure 13:
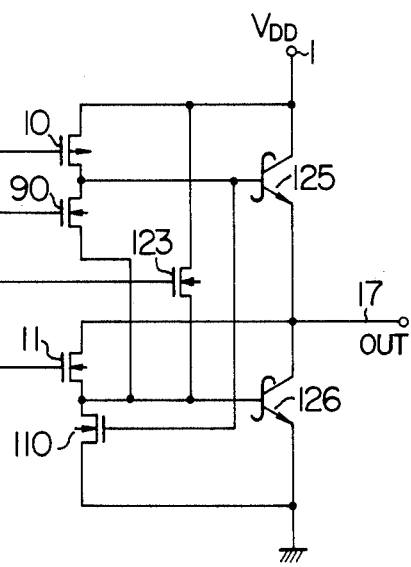
FIG. 13 is a diagram of an inversion output circuit according to a tenth embodiment of this invention.

While the logic circuits for use in LSI are described before, the present invention can be applied to output buffer circuits for driving an external circuit. The examples of such application are shown in FIGS. 11, 12 and 13. Although the three examples are inverter circuits, the buffer circuit may be a multi-input NAND or multi-input NOR.

EMBODIMENT 8

FIG. 11 shows an inverting output circuit of an eighth embodiment of this invention. This circuit has substantially the same construction and similarly operates as the fifth embodiment of FIG. 8.

In FIG. 11, like elements corresponding to those of FIG. 8 are identified by the same reference numerals. Reference numeral 125 represents a first NPN with a Schottky barrier diode provided between the base and collector of the first NPN in FIG. 8 and so on, 126 a second NPN with a Schottky barrier diode provided between the base and collector of the second NPN, and 123 a fourth N-channel metal (silicon)-oxide-semiconductor field-effect-transistor (hereinafter, referred to simply as fourth NMOS) having its gate connected to the input terminal 16 and its drain D and source S respectively connected to the power supply terminal 1 and the base of the second NPN 126.

This embodiment is different from the fifth embodiment 5 of FIG. 8 in that the first and second NPNs 125 and 126 have a Schottky barrier diode added, respectively, for the purpose of accelerating the time of extraction of accumulated charges, due to the saturation of the NPN transistors.

In addition, this embodiment is different from the fifth embodiment of FIG. 8 in that the fourth NMOS 123 is provided between the power supply 1 and the base B of the second NPN 126, with its gate G being connected to the input terminal 16. This is because in the case of output circuit, a sink current $I_{OL}$ needs to be drawn in at a low-level output $V_{OL}$ and hence the second NPN 126 is required to be continuously supplied at its base with current at "1" level of the input terminal 16.

According to this embodiment, a high-speed, low-power consumption inverting output circuit can be realized.

EMBODIMENT 9

FIG. 12 shows an inverting output circuit of a nineth embodiment of this invention. This circuit has substantially the same construction and similarly operates as the sixth embodiment in FIG. 9.

In FIG. 12, like elements corresponding to those of FIGS. 9 and 11 are identified by the same reference numerals, and the resistor 13 in FIG. 11 is replaced by the PJFET 100 as in FIG. 9. This embodiment is different from FIG. 9 in that as in the eighth embodiment, the first and second NPN 125 and 126 have a Schottky barrier diode added, respectively, and that the fourth NMOS 123 is provided for supplying current to the base of the second NPN 126. According to this embodiment, a much higher-speed inverting output circuit can be realized.

EMBODIMENT 10

FIG. 13 shows an inverting output circuit of a tenth embodiment of this invention. This circuit has substantially the same construction and similarly operates as the seventh embodiment of FIG. 10. In FIG. 13, like elements corresponding to those of FIGS. 10 and 11 are identified by the same reference numerals, and the resistor 13 in FIG. 11 is replaced by the third NMOS 110. This embodiment is different from FIG. 10 in that as in the eighth embodiment, the first and second NPN 125 and 126 have a Schottky barrier diode added and that the fourth NMOS 123 is provided for supplying current to the base of the second NPN 126. According to this embodiment, much higher density inverting output circuit can be realized.

EMBODIMENT 11

Figure 14:
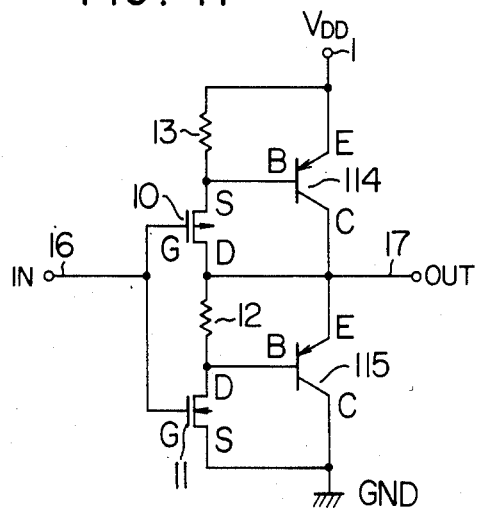
FIG. 14 is a diagram of an inverter circuit according to an eleventh embodiment of this invention.

FIG. 14 shows an inverter circuit of an eleventh embodiment of this invention.

In FIG. 14, reference numeral 114 represents a first PNP bipolar transistor (hereinafter, referred to simply as first PNP) having its emitter E connected to the power supply terminal 1 at which the first fixed potential is kept, and its collector connected to the output terminal 17. Numeral 115 denotes a send PNP bipolar transistor (hereinafter, referred to simply as second PNP) having its emitter E connected to the output terminal 17 and its collector C connected to ground potential GND at which the second fixed potential is maintained. The PMOS 10 has its gate G connected to the input terminal 16, and its source S and drain D respectively connected to the base B and collector C of the first PNP 114. The NMOS 11 has its gate G connected to the input terminal 16 and its drain D and source S respectively connected to the base B and collector C of the second PNP 115. The resistor 12 connects the drain D of the PMOS 10 and that of the NMOS 11. The resistor 13 connects the base B and emitter E of the first PNP 114.

In this embodiment, the NPN bipolar transistors 14 and 15 in the first embodiment are replaced by the PNP bipolar transistors 114 and 115, and the same operation as in the first embodiment is performed.

EMBODIMENT 12

Figure 15:
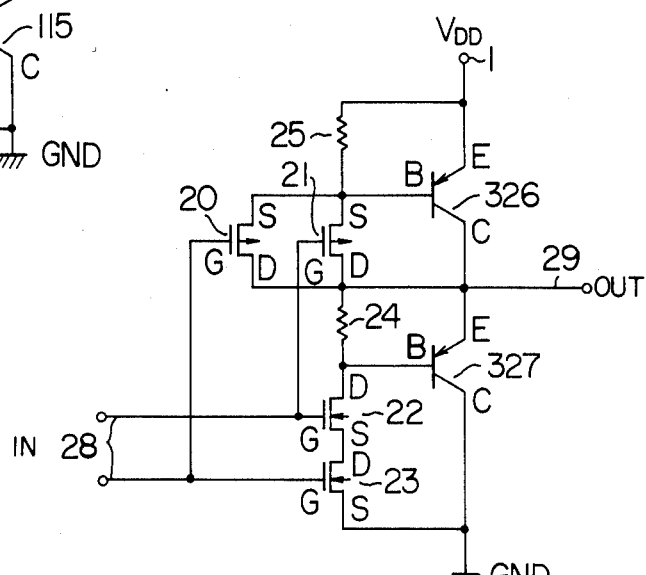
FIG. 15 is a diagram of a two-input NAND circuit according to a twelfth embodiment of this invention.

FIG. 15 shows a two-input NAND circuit of a twelfth embodiment of this invention.

In FIG. 15, reference numeral 326 represents a first PNP having its emitter E connected to the power supply terminal 1 and its collector connected to the output terminal 29, 327 a second PNP having its emitter E connected to the output terminal 29 and its collector C connected to the ground potential GND, 28 two input terminals, and 20 and 21 PMOSs having their gates G connected to on and the other of the input terminals 28, respectively and their source S-drain D paths connected in parallel between the base B and collector C of the first PNP 326. In addition, numerals 22 and 23 represent NMOSs having their gates G respectively connected to one and the other of the input terminals 28 and their drain D-source S paths connected in series between the base B and collector C of the second PNP 327, 24 a resistor connecting the drains D of the PMOSs 20 and 21 with the drain D of the NMOS 22, and 25 a resistor connecting the base B and emitter E of the first PNP 326.

In this embodiment, the NPN bipolar transistors 26 and 27 in the second embodiment of FIG. 5 are respectively replaced by PNP bipolar transistors 326 and 327, and the same operation as in the second embodiment is performed.

While the two-input NANP circuit is described in this embodiment, this invention can be applied to 3-input, 4-input or generally k-input NAND circuit ($k \geq 2$).

EMBODIMENT 13

Figure 16:
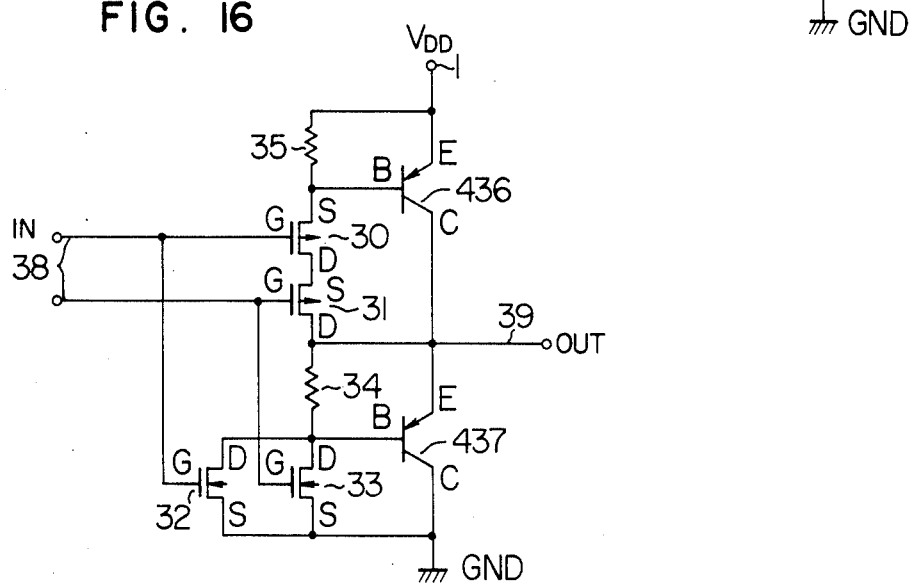
FIG. 16 is a diagram of a two-input NOR circuit according to a thirteenth embodiment of this invention.

FIG. 16 shows a two-input NOR circuit of a thirteenth embodiment of this invention.

In FIG. 16, reference numeral 436 represents a first PNP having its emitter E connected to the power supply 1 and its collector C connected to the output terminal 39, 437 a second PNP having its emitter E connected to the output terminal 39 and its collector C connected to the ground potential GND, 38 two input terminals, 30 and 31 PMOSs having their gates G connected to one and the other of the input terminals 38, respectively, and their source S-drain D paths connected in series between the base B and collector C of the first PNP 436, and 32 and 33 NMOSs having their gates G connected to one and the other of the input terminals 38, respectively and their drain D-source S paths connected in parallel between the base B and collector C of the second PNP 437. In addition, numeral 34 denotes a resistor connecting the drain D of the PMOS 31 with the drains of the NMOSs 32 and 33, and 35 a resistor connecting the base B and emitter E of the first PNP 436.

In this embodiment, the NPN bipolar transistors 36 and 37 in the third embodiment of FIG. 6 are replaced by the PNP bipolar transistors 436 and 437, respectively, and the same operation as in the third embodiment is performed.

While the two-input NOR circuit is described in this embodiment, this invention can be applied to 3-input, 4-input, or generally k-input NOR circuit (k≧2).

It will easily be understood by those skilled in the art that the embodiments 11, 12 and 13 can be modified as the embodiments 4 to 10 of FIGS. 7 to 13.

While in the embodiments of this invention the logic gates are only NAND and NOR circuits, it will easily be understood that other logic gate circuits such as AND and OR circuits, a combination logic circuit, flip-flops or shift registers can be formed by connecting a logic gate circuit of, for example, CMOS transistors to the input side of the NAND and NOR circuits.

According to this invention, as described above, it is possible to produce a high-speed, low-power consumption gate circuit formed of field-effect transistors, and bipolar transistors.

We claim:

1. A bipolar transistor-field effect transistor copmosite circuit comprising:
   an output circuit including
      a pair of first and second bipolar transistors each having a collector of one conductivity type, a base of the other conductivity type and an emitter of the one conductivity type, and
      collector-emitter current paths of said pair of bipolar transistors connected in series to each other between first and second potentials, of which a connection node provides an output of the composite circuit;
   an input circuit including
      at least one field effect transistor of the one conductivity type,
      said input circuit being responsive to a predetermined input to output a signal to the base of said first bipolar transistor for rendering said first bipolar transistor in an on or off state, and
      said field effect transistor being responsive to said predetermined input to output another signal to the base of said second bipolar transistor for rendering said second bipolar transistor in an on or off state in an opposite relation to the on-off state of said first bipolar transistor,
   a first discharge means comprising a field effect transistor of the one conductivity type having a gate coupled to receive said predetermined input applied to the input circuit, said field effect transistor having its source-drain path conencted between the base of said first bipolar transistor and a discharge potential point for discharging from the base charges accumulated in said first bipolar transistor when it is turned into the off state; and
   a second discharge means for discharging charges accumulated in said second bipolar transistor when it is turned into the off state, wherein
      said second discharge means includes a field effect transistor of the one conductivity type connected between the base and the emitter of said second bipolar transistor, whose drain and source are connected to the base side and the emitter side of the second bipolar transistor, respectively, and
      wherein said second discharge means field effect transistor has its gate coupled to the base of said first bipolar transistor for discharging will be switched into an on state when said first bipolar transistor is on, and will be switched into an off state when said first bipolar transistor is off.

2. A composite circuit according to claim 1, wherein said input circuit further comprises
   at least one field effect transistor of the other conductivity type responsive to said predetermined input for forming a path from the first potential to the base of said first bipolar transistor to output the signal for rendering the first bipolar transistor in the on or off state, and
   wherein said at least one field effect transistor of said one conductivity type of the input circuit is responsive to the predetermined input for forming a path from at least the output connection node to the base of the second bipolar transistor to output the signal for rendering the second bipolar transistor in the on or off state.

3. A bipolar transistor-complementary field effect transistor composite circuit for performing a predetermined logic function comprising:
   a first bipolar transistor having a collector of a first conductivity type connected to a first potential and an emitter of the first conductivity type connected to an output terminal, and a base of a second conductivity type;
   a second bipolar transistor having a collector of the first conductivity type connected to the output terminal and an emitter of the first conductivity type connected to a second potential, and a base of the second conductivity type;
   an input circuit including
      a first field effect transistor circuit of the second conductivity type connected between the base and the collector of said first bipolar transistor, and
      a second field effect transistor circuit of the first conductivity type connected between the base and the collector of said second bipolar transistor;
   a first discharge means comprising a field effect transistor of the first conductivity type having a gate coupled to receive a predetermined input applied to the input circuit, said field effect transistor having its source-drain path connected between the base of said first bipolar transistor and a discharge potential point for discharging from the base charges accumulated in said first bipolar transistor;
   a second discharge means for discharging charges accumulated in said second bipolar transistor,
   wherein said second discharge means comprises a third field effect transistor of the first conductivity type connected to the base and the emitter of said second bipolar transistor, and further wherein said third field effect transistor has its gate coupled to the base of said first bipolar transistor and will be switched into an on state when said first bipolar transistor is on, and will be switched into an off state when said first bipolar transistor is off.

4. A bipolar transistor-complementary field effect transistor composite circuit comprising:
   a first bipolar transistor having a collector of a first conductivity type connected to a first potential and an emitter of the first conductivity type connected to an output terminal, and a base of a second conductivity type;
a second bipolar transistor having a collector of the first conductivity type connected to the output terminal and an emitter of the first conductivity type connected to a second potential, and a base of the second conductivity type;
an input circuit including
a first field effect transistor circuit of the second conductivity type connected between the base and collector of said first bipolar transistor, and
a second field effect transistor circuit of the first conductivity type connected between the base and the collector of said second bipolar transistor;
a first discharge means comprising a field effect transistor of the first conductivity type having a gate coupled to receive a predetermined input applied to the input circuit, said field effect transistor having its source-drain path connected between the base of said first bipolar transistor and a discharge potential point for discharging from the base charges accumulated in said first bipolar transistor when it is turned into the off state; and
a second discharge means for discharging charges accumulated in said second bipolar transistor when it is turned into the off state;
wherein said second discharge means comprises a third field effect transistor of the first conductivity type having a gate connected to the base of said first bipolar transistor, and a drain and a source connected to the base and the emitter of said second bipolar transistor.

5. A composite circuit according to claim 3, wherein said first discharge means is a discharge means for discharging charges accumulated in said first bipolar transistor and said first field effect transistor circuit when said first bipolar transistor and said first field effect transistor circuit are switched from the on-state to the off-state, and
said second discharge means is a discharge means for discharging charges accumulated in said second bipolar transistor and said second field effect transistor circuit when said second bipolar transistor and said second field effect transistor circuit are switched from the on-state to the off-state.

6. A composite circuit according to claim 3, wherein said first discharge means is a discharge means for discharging accumulated charges from said first bipolar transistor and said first field effect transistor circuit to the second potential, when said first bipolar transistor and said first field effect transistor circuit are switched from the on-state to the off-state, and
said second discharge means is a discharge means for discharging accumulated charges from said second bipolar transistor and said second field effect transistor circuit to the second potential when said second bipolar transistor and said second field effect transistor circuit are switched from the on-state to the off-state.

7. A gate circuit comprising:
a first bipolar transistor having a collector of a first conductivity type connected to a first potential, an emitter of the first conductivity type connected to an output terminal, and a base of a second conductivity type;
a second bipolar transistor having a collector of the first conductivity type connected to the output terminal, an emitter of the first conductivity type connected to a second potential, and a base of the second conductivity type;
k input terminals ($k \geq 1$);
k field-effect-transistors of the second conductivity type having their gates connected to each of said input terminals respectively, their sources and drains connected between the base and the collector of said first bipolar transistor;
k field-effect-transistors of the first conductivity type having their gates connected to each of said input terminals respectively, and their drains and sources connected between the collector and the base of said second bipolar transistor;
a first discharge means comprising a first effect transistor of the first conductivity type having a gate coupled to receive a predetermined input applied to at least one of the input terminals, said field effect transistor having its source-drain path connected between the base of said first bipolar transistor and a discharge potential point for discharging from the base charges accumulated in said first bipolar transistor; and
a second discharge means for discharging charges accumulated in said second bipolar transistor,
wherein said second discharge means comprises at least a discharging field effect transistor of the first conductivity type connected to the base and the emitter of said second bipolar transistor, and wherein said second discharge means discharging field effect transistor has its gate coupled to the base of said first bipolar transistor and will be switched into an on state when said first bipolar transistor is on, and will be switched into an off state when said first bipolar transistor is off.

8. A gate circuit according to claim 7, wherein said second discharge means is a discharging field effect transistor of the first conductivity type having a gate connected to the base of said first bipolar transistor and a drain and a source connected to the base and the emitter of said second bipolar transistor.

9. A gate circuit according to claim 7, wherein said k field-effect-transistors of the second conductivity type are in series with one another and wherein said k field-effect-transistors of the first conductivity type are in parallel with one another.

10. A gate circuit according to claim 7, wherein said k field-effect-transistors of the second conductivity type are in parallel with one another and wherein said k field-effect-transistors of the first conductivity type are in series with one another.

11. A bipolar transistor-complementary field effect transistor composite circuit comprising:
a first bipolar transistor having a collector of a first conductivity type connected to a first potential and an emitter of the first conductivity type connected to an output terminal, and a base of a second conductivity type
a second bipolar transistor having a collector of the first conductivity type connected to the output terminal and an emitter of the first conductivity type connected to a second potential, and a base of the second conductivity type;
an input circuit including
a first field effect transistor circuit of the second conductivity type connected between the base and the collector of said first bipolar transistor, and a second field effect transistor circuit of the first conductivity type connected between the base and the collector of said second bipolar transistor;

a first discharge means connected to the base of said first bipolar transistor for discharging from the base charges accumulated in said first bipolar transistor when said first bipolar transistor is switched from the on-state to the off-state; and a second discharge means connected to the base of said second bipolar transistor for discharging from the base charges accumulated in said second bipolar transistor when said second bipolar transistor is switched from the on-state to the off-state, wherein said input circuit further comprises a third field effect transistor of the first conductivity type connected between the first potential and the base of said second bipolar transistor.

12. A gate circuit comprising:

a first bipolar transistor having its collector of a first conductivity type connected to a first potential and its emitter of the first conductivity type connected to an output terminal, and a base of a second conductivity type;

a second bipolar transistor having its collector of the first conductivity type connected to the output terminal and its emitter of the first conductivity type connected to a second potential, and a base of the second conductivity type;

k input terminals ($k \geq 1$);

k field-effect-transistors of the second conductivity type having their gates connected to each of said input terminals respectively, their sources and drains connected between the base and the collector of said first bipolar transistor respectively;

k field-effect-transistors of the first conductivity type having their gates connected to each of said input terminals respectively, and their drains and sources connected between the collector and the base of said second bipolar transistor;

a first discharge means connected to the base of said first bipolar transistor for discharging from the base charges accumulated in said first bipolar transistor when said first bipolar transistor is switched from the on-state to the off-state; and a second discharge means connected to the base of said second bipolar transistor for discharging from the base charges accumulated in said second bipolar transistor when said second bipolar transistor is switched from the on-state to the off-state, wherein said gate circuit comprises a field effect transistor of the first conductivity type having its gate connected to one of said k input terminals, and its drain and source respectively connected to the first potential and the base of said second bipolar transistor.

13. A gate circuit according to claim 12, wherein said k field-effect-transistors of the second conductivity type are in series with one another and wherein said k field-effect-transistors of the first conductivity type are in parallel with one another.

14. The gate circuit according to claim 12, wherein said k field-effect-transistors of the second conductivity type are in parallel with one another and wherein said k field-effect-transistors of the first conductivity type are in series with one another.

15. A circuit according to claim 11, wherein each of said first and second bipolar transistors includes a Schottky barrier diode coupled between its base and collector.

16. A circuit according to claim 12, wherein each of said first and second bipolar transistors includes a Schottky barrier diode coupled between its base and collector.

17. A circuit according to claim 13, wherein each of said first and second bipolar transistors includes a Schottky barrier diode coupled between its base and collector.

18. A circuit according to claim 14, wherein each of said first and second bipolar transistors includes a Schottky barrier diode coupled between its base and collector.

19. A composite circuit according to claim 1, wherein said field effect transistor of said input circuit is coupled to have its source-drain path coupled between the base side and the collector side of said second bipolar transistor.

20. A circuit according to claim 1, wherein said field effect transistor of said first discharge means has its source-drain path connected between the base of the first bipolar transistor and the base of the second bipolar transistor.

21. A circuit according to claim 3, wherein said field effect transistor of said first discharge means has its source-drain path connected between the base of the first bipolar transistor and the base of the second bipolar transistor.

22. A circuit according to claim 4, wherein said field effect transistor of said first discharge means has its source-drain path connected between the base of the first bipolar transistor and the base of the second bipolar transistor.

23. A circuit according to claim 7, wherein said field effect transistor of said first discharge means has its source-drain path connected between the base of the first bipolar transistor and the base of the second bipolar transistor.

* * * * *

UNITED STATES PATENT AND TRADEMARK OFFICE
CERTIFICATE OF CORRECTION

PATENT NO. : 4,719,373

DATED : Jan. 12, 1988

INVENTOR(S) : Masuda et al

It is certified that error appears in the above-identified patent and that said Letters Patent is hereby corrected as shown below:

Column 11, line 26, "copmo-" should read --compo--.

Column 12, lines 3 and 4, "wherein said second discharge means field effect transistor has" should read --wherein said field effect transistor of said second discharge means having--.

Signed and Sealed this

Thirty-first Day of October, 1989

Attest:

DONALD J. QUIGG

Attesting Officer

Commissioner of Patents and Trademarks